(12) United States Patent
Wang et al.

(10) Patent No.: US 9,490,826 B1
(45) Date of Patent: Nov. 8, 2016

(54) METHODS AND APPARATUS FOR SYNCHRONIZING FREQUENCY DIVIDERS USING A PULSE SWALLOWING TECHNIQUE

(71) Applicant: QUALCOMM Incorporated, San Diego, CA (US)

(72) Inventors: Cheng-Han Wang, San Jose, CA (US); Keplin Victor Johansen, Campbell, CA (US); Jeongsik Yang, San Jose, CA (US); Justin Phelps Black, Santa Clara, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/829,723

(22) Filed: Aug. 19, 2015

(51) Int. Cl.
  *H03L 7/06* (2006.01)
  *H03L 7/099* (2006.01)
(52) U.S. Cl.
  CPC ..................................... *H03L 7/099* (2013.01)
(58) Field of Classification Search
  USPC .............. 327/2–12, 105–123, 141, 144–163; 331/15–17; 365/373–376
  See application file for complete search history.

(56) References Cited

U.S. PATENT DOCUMENTS

| | | | | |
|---|---|---|---|---|
| 5,948,046 A * | 9/1999 | Hagberg | ............... | H03K 23/667 377/47 |
| 5,982,242 A * | 11/1999 | Jun | ........................... | H03L 7/24 331/2 |
| 7,109,803 B2 | 9/2006 | Rebel | | |
| 7,414,490 B2 * | 8/2008 | Jeon | ..................... | H03B 5/1228 331/179 |
| 8,278,982 B2 | 10/2012 | Beccue | | |
| 2004/0095121 A1 * | 5/2004 | Kernahan | ............. | H02M 3/156 323/283 |
| 2005/0186920 A1 | 8/2005 | Staszewski et al. | | |
| 2008/0079501 A1 * | 4/2008 | Hulfachor | ............... | H03L 7/087 331/16 |
| 2008/0197891 A1 * | 8/2008 | Park | ........................ | H03L 7/183 327/105 |
| 2010/0001772 A1 * | 1/2010 | Eleftheriou | ...... | G11B 20/10009 327/158 |

OTHER PUBLICATIONS

Co-pending U.S. Appl. No. 14/495,183, filed Sep. 24, 2014.
Co-pending U.S. Appl. No. 14/615,002, filed Feb. 5, 2015.
Zhou X.S., et al., "A New Approach for a Phase Controlled Self-Oscillating Mixer," IEEE Transactions on Microwave Theory and Techniques, Feb. 1997, vol. 45 (2), pp. 196-204.

* cited by examiner

*Primary Examiner* — Brandon S Cole
(74) *Attorney, Agent, or Firm* — Patterson & Sheridan, L.L.P.

(57) ABSTRACT

Methods and apparatus for synchronizing dividers in different LO paths using pulse swallowing. One example apparatus generally includes a first path having a first frequency divider configured to generate a first divided signal from a first periodic signal; a second path having a second frequency divider configured to generate a second divided signal from a second periodic signal; a phase detector configured to compare phases of a first sensing signal based on the first divided signal and a second sensing signal based on the second divided signal and to generate a first trigger signal if the first and second sensing signals are out-of-phase; and a first pulse suppressor configured to suppress a pulse of the first periodic signal for at least one cycle in response to the first trigger signal to adjust a phase of the first divided signal.

30 Claims, 8 Drawing Sheets

METHODS AND APPARATUS FOR SYNCHRONIZING FREQUENCY DIVIDERS USING A PULSE SWALLOWING TECHNIQUE

TECHNICAL FIELD

Certain aspects of the present disclosure generally relate to electronic circuits and, more particularly, to synchronizing frequency dividers in different oscillator paths based on a pulse swallowing technique.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a wireless local area network (WLAN) in accordance with the Institute of Electrical and Electronics Engineers (IEEE) 802.11 standard (e.g., Wi-Fi) or a wireless personal area network (WPAN) in accordance with the IEEE 802.15 standard. Another example wireless network may be a 3G (the third generation of mobile phone standards and technology), 4G, or later generation system, which may provide network service via any one of various radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The forward and/or reverse links may be established via a single-in single-out (SISO), multiple-in single-out (MISO), or a multiple-in multiple-out (MIMO) techniques.

A MIMO system employs multiple ($N_T$) transmit antennas and multiple ($N_R$) receive antennas for data transmission. A MIMO channel formed by the $N_T$ transmit and $N_R$ receive antennas may be decomposed into $N_S$ independent channels, which are also referred to as spatial channels, where $N_S \leq \min\{N_T, N_R\}$. Each of the $N_S$ independent channels corresponds to a dimension. The MIMO system can provide improved performance (e.g., higher throughput and/or greater reliability) if the additional dimensionalities created by the multiple transmit and receive antennas are utilized.

Certain radio frequency (RF) front-ends of wireless communication devices (e.g., mobile stations and/or base stations employed in MIMO communications) have multiple receiver (RX) paths, multiple transmitter (TX) paths, or multiple transceiver paths, also known as chains. Each of these paths (chains) in a multipath RF front-end may have its own local oscillator (LO). The various LO signals may be generated from a single voltage-controlled oscillator (VCO) using, for example, a divide-by-2 (Div2) frequency divider associated with each LO path. Although all of the frequency dividers may output the same LO frequency, each divider in an LO path may arbitrarily start-up either in-phase (0°) or out-of-phase (180°) relative to another divider in another LO path. In order to achieve particular capabilities or perform certain functions, such as beamforming and MIMO communication, it may be desirable to operate the dividers located in different LO paths in-phase.

Accordingly, what is needed are techniques and apparatus for detecting whether two or more high frequency periodic signals are in-phase or out-of-phase and adjusting phases of out-of-phase signals.

SUMMARY

Certain aspects of the present disclosure generally relate to adjusting phases of signals output by frequency dividers in different circuit paths (e.g., in an effort to synchronize the divided signals) using pulse suppression.

Certain aspects of the present disclosure provide an apparatus for generating multiple periodic signals. The apparatus generally includes a first circuit path having a first frequency divider configured to frequency divide a first periodic signal to generate a first divided signal; a second circuit path having a second frequency divider configured to frequency divide a second periodic signal to generate a second divided signal; a phase detection circuit coupled to the first and second circuit paths and configured to compare phases of a first sensing signal based on the first divided signal and of a second sensing signal based on the second divided signal and to generate a first trigger signal if the first and second sensing signals are out-of-phase; and a first pulse suppression circuit coupled to the phase detection circuit and configured to suppress a pulse of the first periodic signal for at least one cycle in response to the first trigger signal to adjust a phase of the first divided signal.

According to certain aspects, the first sensing signal is the first divided signal (or is a buffered version of the first divided signal). For certain aspects, the second sensing signal is the second divided signal (or is a buffered version of the second divided signal).

According to certain aspects, the apparatus further includes a second pulse suppression circuit coupled to the phase detection circuit, wherein the phase detection circuit is configured to generate a second trigger signal if the first and second sensing signals are out-of-phase and wherein the second pulse suppression circuit is configured to suppress a pulse of the second periodic signal for at least one cycle in response to the second trigger signal to adjust a phase of the second divided signal.

According to certain aspects, the apparatus further includes a third frequency divider configured to frequency divide the first divided signal to generate a third divided signal, wherein the first sensing signal is the third divided signal (or a buffered version of the third divided signal); and a fourth frequency divider configured to frequency divide the second divided signal to generate a fourth divided signal, wherein the second sensing signal is the fourth divided signal (or a buffered version of the fourth divided signal). For certain aspects, the apparatus further includes a second pulse suppression circuit coupled to the phase detection circuit, wherein the phase detection circuit is configured to generate a second trigger signal if the first and second sensing signals are out-of-phase, wherein the second pulse suppression circuit is configured to suppress the first divided signal for at least one cycle in response to the second trigger signal to adjust a phase of the third divided signal. For certain aspects, the apparatus further includes a third pulse suppression circuit coupled to the phase detection circuit, wherein the phase detection circuit is configured to generate a third trigger signal if the first and second sensing signals are out-of-phase and wherein the third pulse suppression circuit is configured to suppress a pulse of the second periodic signal for at least one cycle in response to the third trigger signal to adjust a phase of the second divided signal. For certain aspects, the apparatus further includes a fourth pulse suppression circuit coupled to the phase detection circuit, wherein the phase detection circuit is configured to generate a fourth trigger signal if the first and second sensing signals are out-of-phase and wherein the fourth pulse suppression circuit is configured to suppress a pulse of the second divided signal for at least one cycle in response to the fourth trigger signal to adjust a phase of the fourth divided signal.

According to certain aspects, the apparatus further includes a third circuit path having a third frequency divider configured to frequency divide a third periodic signal to generate a third divided signal, wherein the phase detection circuit is further coupled to the third circuit path and is further configured to compare phases of a third sensing signal based on the third divided signal and of either the first sensing signal or the second sensing signal and to generate a second trigger signal if the third sensing signal and either the first or second sensing signal, respectively, are out-of-phase; and a second pulse suppression circuit coupled to the phase detection circuit and configured to suppress a pulse of the third periodic signal for at least one cycle in response to the second trigger signal to adjust a phase of the third divided signal.

According to certain aspects, the first pulse suppression circuit includes a plurality of delay (D) flip-flops and first combinational logic interfaced with outputs of the plurality of D flip-flops to generate a gating pulse based on the first periodic signal and the first trigger signal from the phase detection circuit; and second combinational logic interfaced with outputs of the first combinational logic and the first periodic signal and configured to suppress the pulse of the first periodic signal for the at least one cycle based on the gating pulse.

According to certain aspects, the phase detection circuit includes exclusive OR (XOR) logic configured to receive the first and second sensing signals; one or more low-pass filters coupled to the XOR logic; and one or more comparators coupled to the one or more low-pass filters and configured to generate one or more outputs of the phase detection circuit, including the first trigger signal.

According to certain aspects, the phase detection circuit is configured to compare the phases of the first and second sensing signals (only) if the apparatus is reset or power cycled.

According to certain aspects, the first frequency divider comprises a first in-phase/quadrature (I/Q) frequency divider configured to generate I and Q versions of the first divided signal, and the second frequency divider comprises a second I/Q frequency divider configured to generate I and Q versions of the second divided signal. For certain aspects, the first sensing signal is based on the I version of the first divided signal, and the second sensing signal is based on the I version of the second divided signal. For other aspects, the first sensing signal is based on the Q version of the first divided signal, and the second sensing signal is based on the Q version of the second divided signal.

According to certain aspects, the phase detection circuit is configured to detect a 0 or 180° phase difference between the first and second sensing signals. For other aspects, the phase detection circuit is configured to detect a 0, 90°, 180°, or 270° phase difference between the first and second sensing signals.

According to certain aspects, the phase of the first divided signal is adjusted such that the first and second divided signals are in-phase.

According to certain aspects, the apparatus further includes a voltage-controlled oscillator (VCO), a first amplifier configured to generate the first periodic signal from an output signal of the VCO, and a second amplifier configured to generate the second periodic signal from the output signal of the VCO.

Certain aspects of the present disclosure provide a method of generating multiple periodic signals. The method generally includes frequency dividing a first periodic signal to generate a first divided signal; frequency dividing a second periodic signal to generate a second divided signal; comparing phases of a first sensing signal based on the first divided signal and of a second sensing signal based on the second divided signal; generating a first trigger signal if the first and second sensing signals are out-of-phase; and suppressing a pulse of the first periodic signal for at least one cycle in response to the first trigger signal to adjust a phase of the first divided signal.

Certain aspects of the present disclosure provide an apparatus for generating multiple periodic signals. The apparatus generally includes means for frequency dividing a first periodic signal to generate a first divided signal; means for frequency dividing a second periodic signal to generate a second divided signal; means for comparing phases of a first sensing signal based on the first divided signal and of a second sensing signal based on the second divided signal; means for generating a first trigger signal if the first and second sensing signals are out-of-phase; and means for suppressing a pulse of the first periodic signal for at least one cycle in response to the first trigger signal to adjust a phase of the first divided signal.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
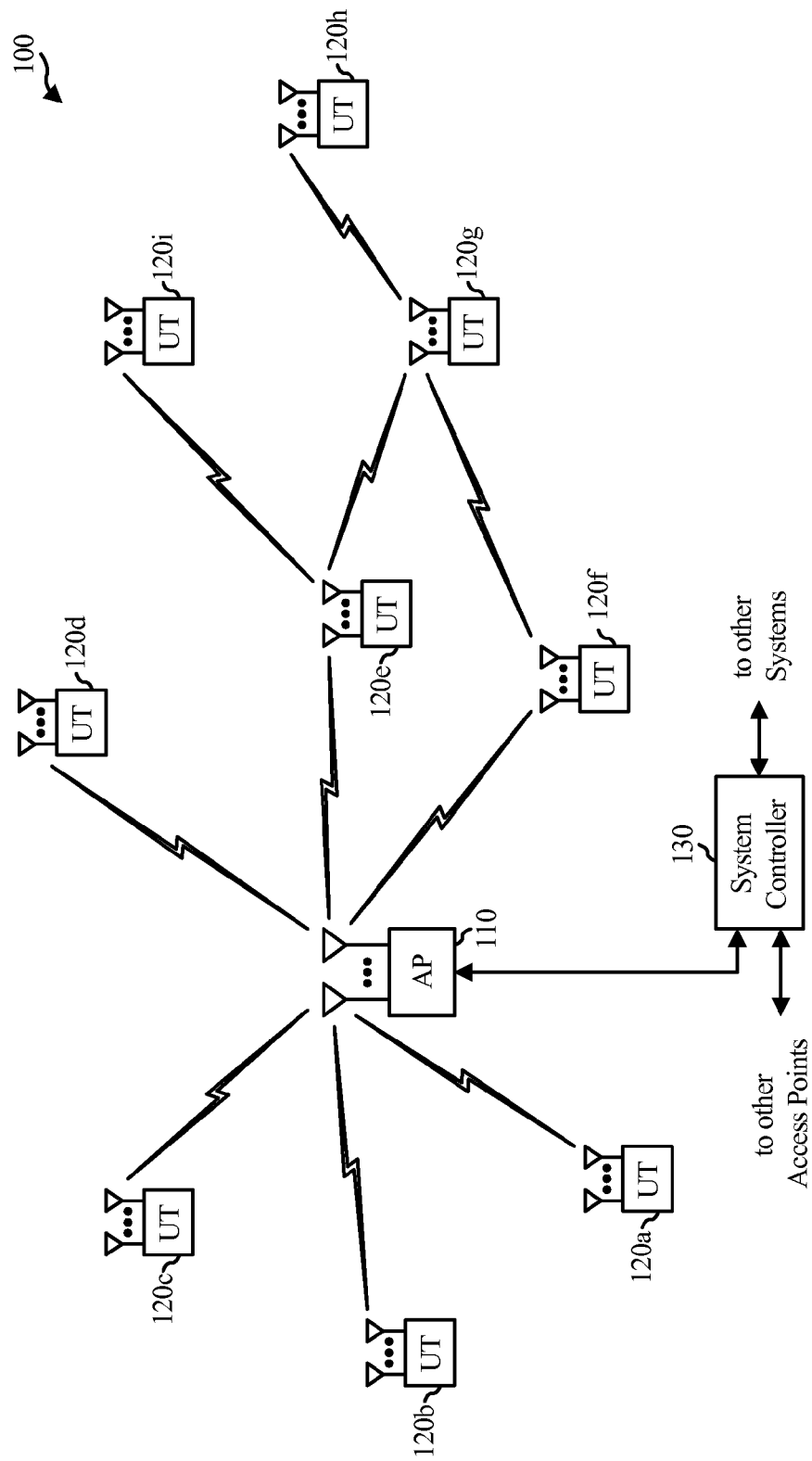
FIG. 1 is a diagram of an example wireless communications network, in accordance with certain aspects of the present disclosure.

Certain aspects of the present disclosure provide methods and apparatus for synchronizing (or at least adjusting) phases of periodic (clock) signals generated by independent frequency dividers in different local oscillator (LO) paths in, for example, a transmitter, receiver, or transceiver of a wireless communication device. This synchronization may be performed by detecting whether two divided signals from independent frequency dividers in two different LO paths are out-of-phase and, if so, suppressing at least one cycle of a periodic signal input to one of the frequency dividers to adjust the phase of the resulting output from this frequency divider.

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and the like. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11 (Wireless Local Area Network (WLAN)), IEEE 802.16 (Worldwide Interoperability for Microwave Access (WiMAX)), Long Term Evolution (LTE) (e.g., in TDD and/or FDD modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

Although particular aspects are described herein, many variations and permutations of these aspects fall within the scope of the disclosure. Although some benefits and advantages of the preferred aspects are mentioned, the scope of the disclosure is not intended to be limited to particular benefits, uses or objectives. Rather, aspects of the disclosure are intended to be broadly applicable to different technologies, system configurations, networks and protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

An Example Wireless System

FIG. 1 illustrates a wireless communications system 100 with access points 110 and user terminals 120, either of which may include or utilize aspects of the present disclosure. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc. In certain aspects of the present disclosure, an access point 110 or a user terminal 120 may include multiple oscillator paths with frequency dividers, where phases of the signals output by the dividers in one or more of the oscillator paths may be synchronized, or at least adjusted, as described below.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink may share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

Figure 2:
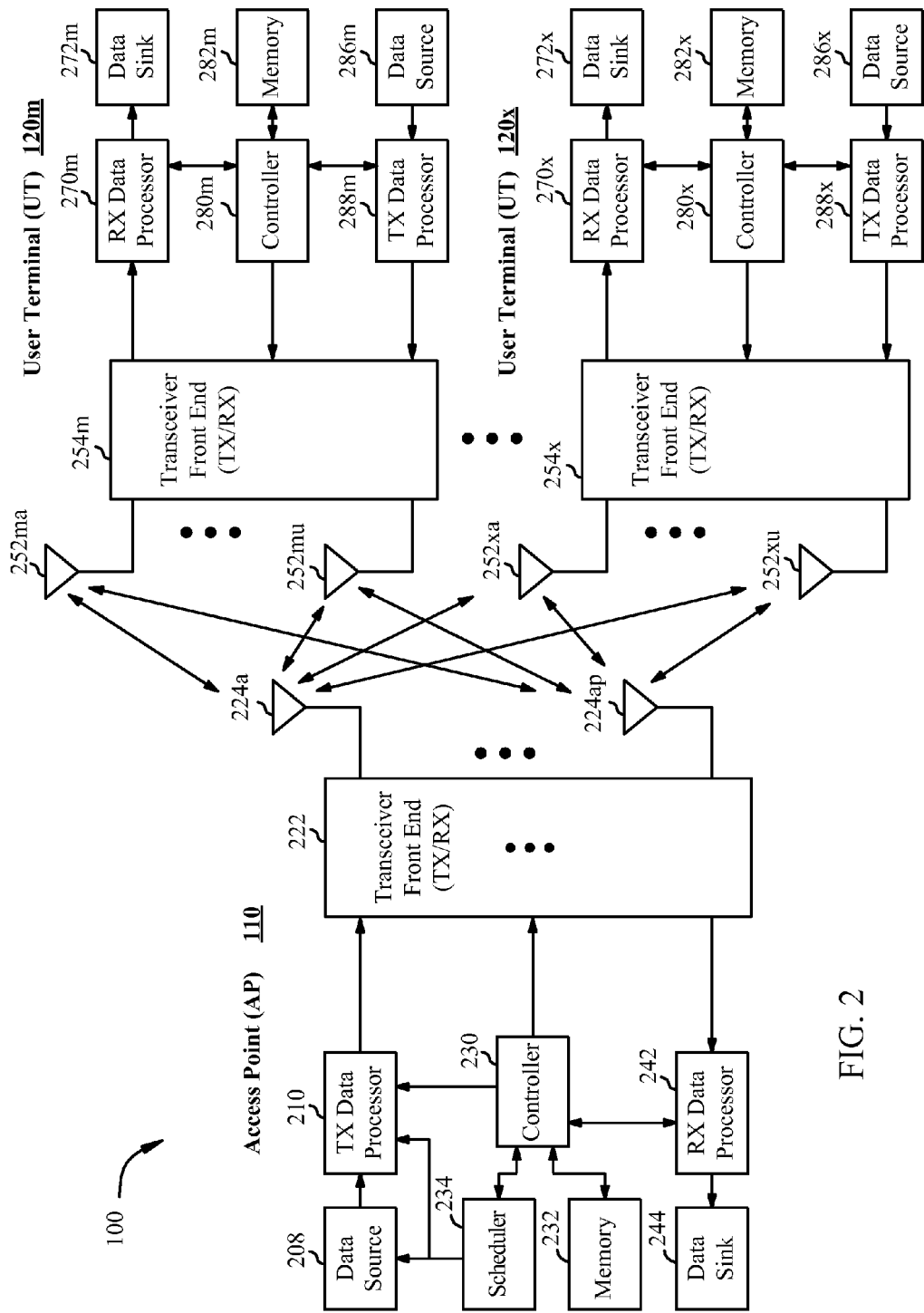
FIG. 2 is a block diagram of an example access point (AP) and example user terminals, in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front-end (TX/RX) 254 (also known as a radio frequency front-end (RFFE)) receives and processes (e.g., converts to analog, amplifies, filters, and frequency upconverts) a respective symbol stream to generate an uplink signal. The transceiver front-end 254 may also route the uplink signal to one of the $N_{ut,m}$ antennas for transmit diversity via an RF switch, for example. The controller 280 may control the routing within the transceiver front-end 254. Memory 282 may store data and program codes for the user terminal 120 and may interface with the controller 280.

A number $N_{up}$ of user terminals may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front-end 222 may select signals received from one of the antennas 224 for processing. For certain aspects, a combination of the signals received from multiple antennas 224 may be combined for enhanced receive diversity. The access point's transceiver front-end 222 also performs processing complementary to that performed by the user terminal's transceiver front-end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. In certain aspects of the present disclosure, either or both transceiver front ends 222 and 254 may include multiple local oscillator (LO) paths with frequency dividers, where phases of the signals output by the dividers in one or more of the LO paths may be adjusted in an effort to synchronize the dividers' output signals, as described below.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front-end 222 receives and processes (e.g., converts to analog, amplifies, filters, and frequency upconverts) the symbol stream to generate a downlink signal. The transceiver front-end 222 may also route the downlink signal to one or more of the $N_{ap}$ antennas 224 for transmit diversity via an RF switch, for example. The controller 230 may control the routing within the transceiver front-end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front-end 254 may select signals received from one of the antennas 252 for processing. For certain aspects, a combination of the signals received from multiple antennas 252 may be combined for enhanced receive diversity. The user terminal's transceiver front-end 254 also performs processing complementary to that performed by the access point's transceiver front-end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
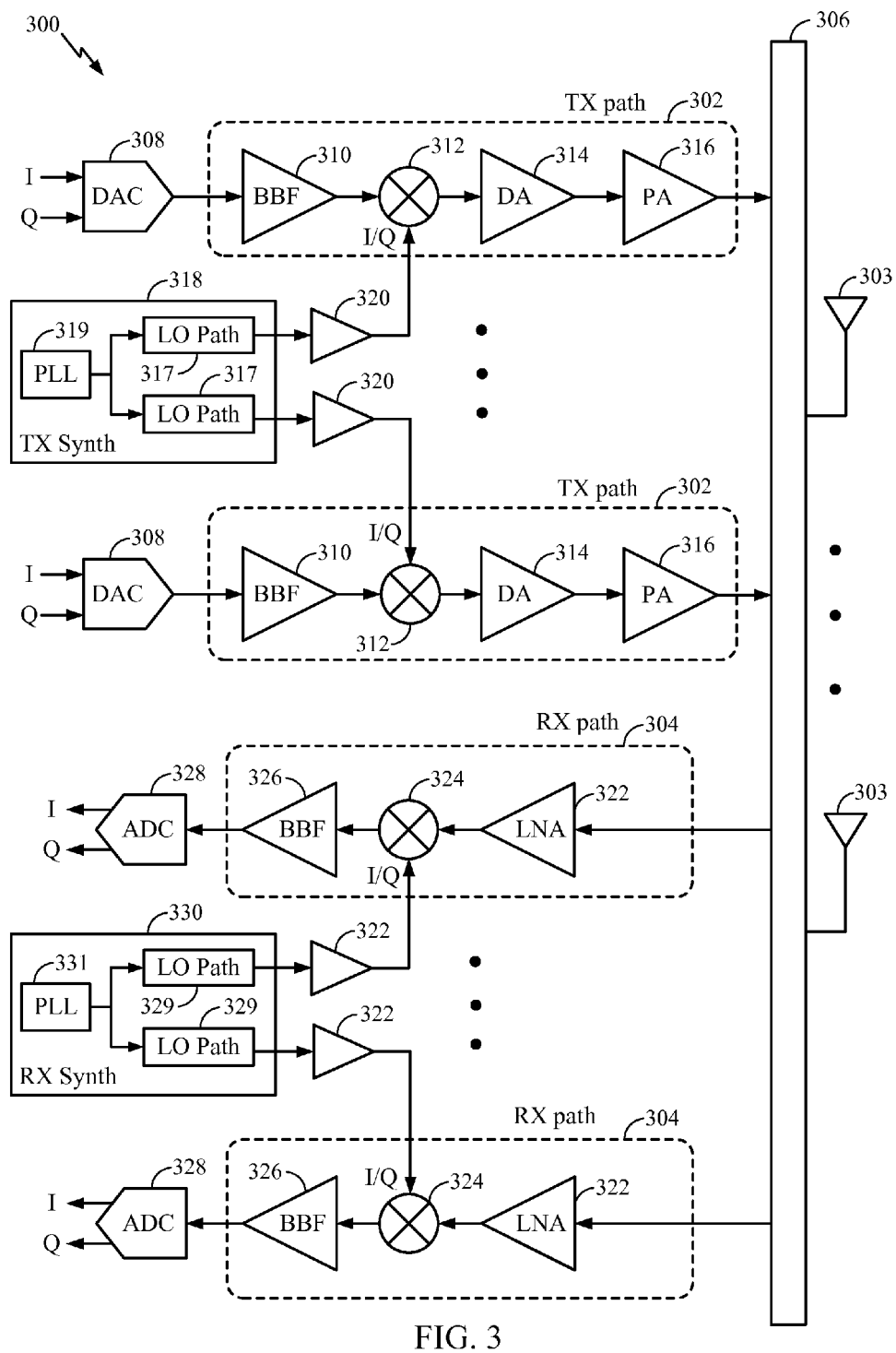
FIG. 3 is a block diagram of an example transceiver front-end, in accordance with certain aspects of the present disclosure.

FIG. 3 is a block diagram of an example transceiver front-end 300, such as transceiver front-ends 222, 254 in FIG. 2, in which aspects of the present disclosure may be practiced. The transceiver front-end 300 includes at least one transmit (TX) path 302 (also known as a transmit chain) for transmitting signals via one or more antennas 303 and at least one receive (RX) path 304 (also known as a receive chain) for receiving signals via the antennas. When a TX path 302 and an RX path 304 share an antenna 303, the paths may be connected with the antenna 303 via an interface 306, which may include any of various suitable RF devices, such as a duplexer, a switch, a diplexer, and the like.

Receiving in-phase (I) and/or quadrature (Q) baseband analog signals from a digital-to-analog converter (DAC) 308, each TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by an antenna 303.

Each RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components (e.g., the BBF 310, the mixer 312, and the DA 314). RF signals received via an antenna 303 may be amplified by the LNA 322, and the mixer 324 mixes the amplified RF signals with a receive local oscillator (LO) signal to convert the RF signal of interest to a lower, baseband frequency (i.e., downconvert). The baseband signals output by the mixer 324 may be filtered by the BBF 326 before being converted by an analog-to-digital converter (ADC) 328 to digital I and/or Q signals for digital signal processing.

While it is desirable for the output of an LO to remain stable in frequency, tuning to different frequencies indicates using a variable-frequency oscillator, which involves compromises between stability and tunability. Contemporary systems employ frequency synthesizers with a phase-locked loop (PLL) including a voltage-controlled oscillator (VCO) to generate a stable, tunable LO with a particular tuning range. Thus, each transmit LO is typically produced by an LO path 317 in a TX frequency synthesizer 318 with a PLL 319, and each transmit LO may be buffered or amplified by an amplifier 320 before being mixed with the baseband signals in the mixer 312. Similarly, each receive LO is typically produced by an LO path 329 in an RX frequency synthesizer 330 with a PLL 331, which may be buffered or amplified by an amplifier 332 before being mixed with the RF signals in the mixer 324. In certain aspects of the present disclosure, the TX and/or RX frequency synthesizers 318, 330 may include multiple local oscillator (LO) paths 317, 329 with frequency dividers, where phases of the signals output by the dividers in one or more of the LO paths 317, 329 may be synchronized, or at least adjusted, as described below.

Example Pulse Swallowing Technique for Phase Adjustment

Certain applications, such as multiple input, multiple output (MIMO) and beamforming, entail utilizing multiple signal paths (e.g., multiple TX paths 302 or multiple RX paths 304) with a fixed phase relationship between signals input to or output from these multiple paths. With this fixed phase relationship between signals, the multiple signals can be added constructively when combined. Typically, the frequency divider circuitry involved in generating LO signals for these TX/RX paths is implemented with independent circuits to be able to avoid routing sensitive in-phase (I) and/or quadrature (Q) signals over relatively long distances. If the I/Q frequency dividers have the same reset condition, then the relative I-Q phase difference may be guaranteed. However, because of the independence and physical distance from each other, there may be unavoidable time delays between each of the frequency dividers in different LO paths (e.g., LO paths 317, 329) after coming out of reset (or start-up). These time delays are responsible for random bimodal (or multimodal) phase relationships with respect to one another, thereby causing the combined signals from these paths to also be bimodal (or multimodal) (e.g., sometimes adding constructively, sometimes destructively). Therefore, a method of guaranteeing that these independent frequency dividers have a fixed phase relationship is desired.

Conventional solutions for synchronizing frequency dividers in different LO paths have been based on either more complex techniques that include injection locking or simpler techniques involving flipping outputs of frequency dividers. The former techniques utilize one or more alternate signal paths, which may undesirably consume additional power, especially in portable devices with limited battery power and tight power budgets. The latter techniques may cause undesired bimodal behavior in outputs of the frequency dividers in different LO paths.

Certain aspects of the present disclosure provide techniques and apparatus for synchronizing phases of two or more independent frequency dividers in different LO paths of a frequency synthesizer, such as that found in an RF front-end of a wireless transceiver. One example technique involves detecting a rising edge of a synchronization input and converting this input into a pulse the width of which is one period of an input clock (periodic signal). This pulse may be then used to gate the input clock to a frequency divider in an LO path for at least one cycle. An output of the divider with the gated (suppressed or swallowed) input pulse(s) is then effectively delayed by a certain desired period (e.g., one half of a clock cycle), thus bringing the out-of-sync dividers in different LO paths in-phase.

Figure 5:
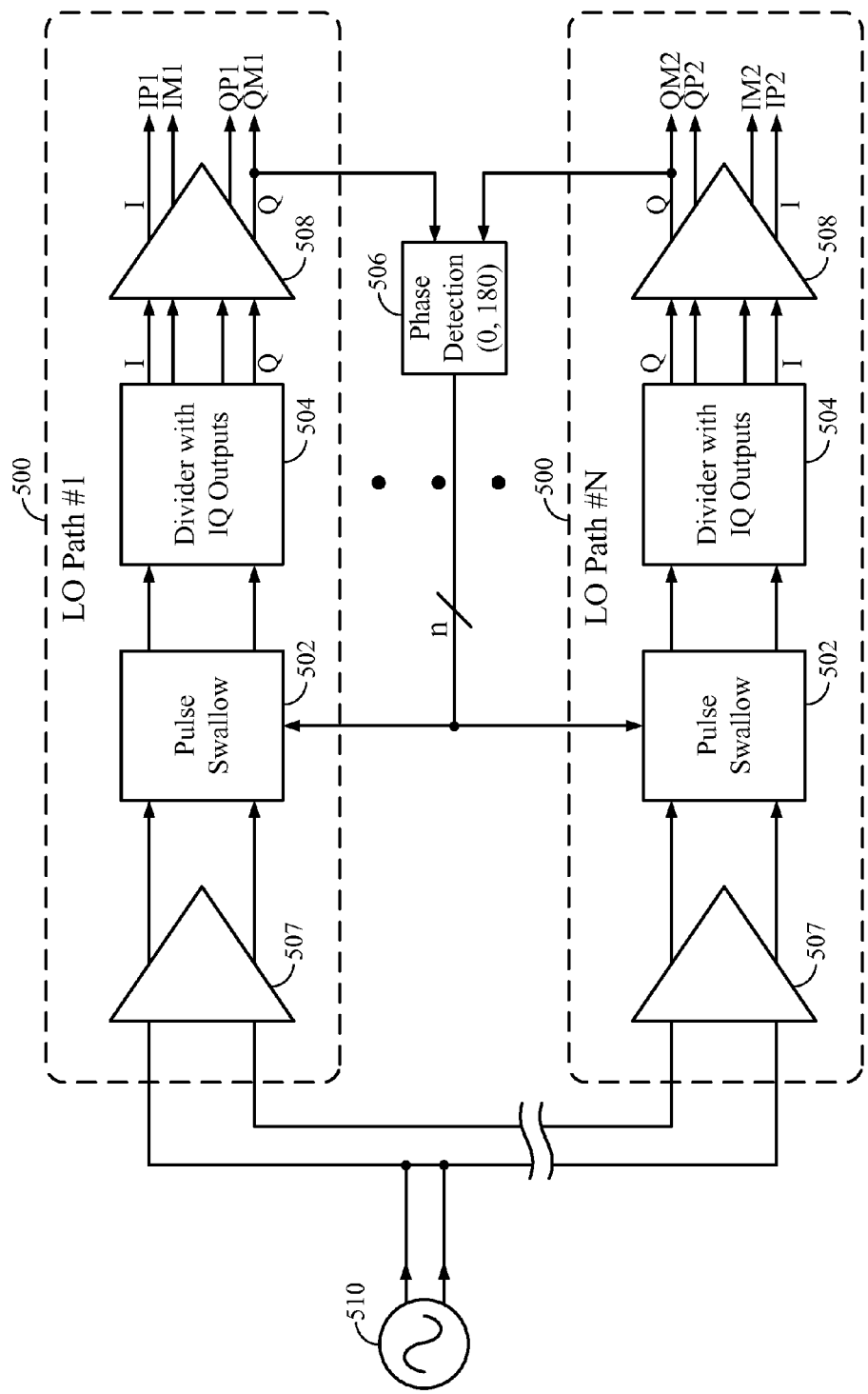
FIG. 5 is a block diagram of multiple example local oscillator (LO) paths, where periodic (clock) signals generated by frequency dividers in the different LO paths may be synchronized using a pulse swallowing circuit in each LO path, in accordance with certain aspects of the present disclosure.

FIG. 5 is a block diagram of N example LO paths 500 (e.g., TX LO paths 317 or RX LO paths 329), where N is an integer greater than or equal to 2, in accordance with certain aspects of the present disclosure. Each LO path 500 may include a pulse swallowing circuit 502 interfaced with a frequency divider 504. Each frequency divider 504 is configured to frequency divide an input periodic signal into an output periodic signal having a lower frequency. For example, each frequency divider 504 may be a divide-by-2 (Div2), divide-by-3 (Div3), or divide-by-4 (Div4) frequency divider. The frequency divider 504 may be configured to output both in-phase (I) and quadrature (Q) signals as illustrated in FIG. 5. Each LO path may also include an input amplifier 507 and/or an output amplifier 508. The input amplifier 507 may be configured to buffer or amplify an oscillating signal received from a VCO 510, such as a VCO in a PLL of a frequency synthesizer (e.g., TX or RX frequency synthesizer 318, 330). The output amplifier 508 may be configured to buffer or amplify an output (e.g., the I and/or Q outputs) of the frequency divider 504.

As shown in FIG. 5, the VCO 510, the input amplifier 507, the pulse swallowing circuit 502, the frequency divider 504, and the output amplifier 508 may be implemented with differential components that receive and/or output differential signals. For example, for a differential frequency divider 504 having both I and Q outputs as illustrated in FIG. 5, the I output is a differential I pair, and the Q output is a differential Q pair. However, a person having ordinary skill in the art will understand that any of these components may be implemented with single-ended components.

An output (I or Q output) of the divider 504 or of the output amplifier 508 in each LO path 500 may be input to a phase detection circuit 506. The phase detection circuit 506 may be implemented with logic configured to detect the phase difference between any two signals. In the case of Div2 frequency dividers, for example, the phase detection circuit 506 may determine whether a (buffered) divided signal of one LO path is in-phase (0° phase shift) or out-of-phase (180° phase shift) with a (buffered) divided signal of another LO path. If the phase detection circuit 506 determines the 180° phase difference condition between a pair of dividers 504, the phase detection circuit 506 may activate the pulse swallowing circuit 502 interfaced with one of the dividers 504 to suppress ("swallow") an input clock pulse to that specific divider 504, such that the divided signal output by this divider will then be synchronized with the divided signal output by the other divider in the pair. In other words, the pulse swallowing circuit 502 may be used to effectively flip the phase of a divided periodic signal in the LO path 500.

For certain aspects (e.g., in the case of frequency dividers dividing by more than two, such as Div3 or Div4 dividers), the phase detection circuit may detect additional or other phase differences besides 0° and 180°. In such cases, a pulse swallowing circuit 502 may be configured to suppress more than one input clock pulse to a particular frequency divider.

For certain aspects, a (buffered) divided signal from an arbitrary one of the LO paths 500 may be used as a reference signal to which all the other (buffered) divided signals from the other LO paths 500 may be compared in the phase detection circuit 506. In this case, the reference LO path (associated with the single reference signal) need not have a pulse swallowing circuit 502 because the reference signal cannot be out-of-phase with itself. However, this reference LO path may include a pulse swallowing circuit 502 for practical reasons, such as ease of RFIC layout with replicated LO paths 500, even though this particular pulse swallowing circuit may never be activated.

For other aspects, a daisy chain technique may be used for iteratively synchronizing the divided LO signals. With this daisy chain technique, an arbitrary pair of (buffered) divided signals may be compared in the phase detection circuit 506. For certain aspects, the pair of signals may be from adjacent LO paths. If the two signals are in-phase, then neither pulse swallowing circuit 502 may be activated (or both circuits could be activated if desired). However, if the two signals are out-of-phase, then either one of the pulse swallowing circuits 502 may be activated such that a clock cycle of a periodic signal input to that particular circuit 502 is suppressed and then both divided signals in the pair of LO paths 500 will be synchronized. Similar to the reference signal technique above, one of the LO paths 500 in the initial pair selected need not have a pulse swallowing circuit 502. Once both divided signals in the pair are in-phase, then one of these (buffered) divided signals may be compared in the phase detection circuit 506 to another (buffered) divided signal from a third LO path, and the pulse swallowing circuit 502 in this third LO path is activated if these two signals are out-of-phase. The third LO path may be adjacent to the initial pair of LO paths for certain aspects. This iterative process may be repeated until all of the divided signals produced in the various LO paths are synchronized.

These synchronization techniques based on phase detection may be performed after each start-up, reset, or power cycle of a frequency synthesizer with the multiple LO paths 500. By using either the reference signal or the daisy chain technique, the N periodic (clock) signals generated by the frequency dividers 504 in the various LO paths 500 in FIG. 5 may be synchronized using a pulse swallowing circuit 502 in each LO path (or a pulse swallowing circuit 502 in each of at least N−1 LO paths, as described above).

According to certain aspects of the present disclosure, the frequency synthesizer may comprise an additional frequency divider (e.g., in each LO path or in a separate phase detection path interfacing one or more outputs of the additional frequency divider with the phase detection circuit) to produce one or more additional frequency divided signals (at a lower frequency) or to reduce the frequency for phase detection, respectively. In the latter case, the phase detection circuit may be configured to detect extra phase differences (e.g., 0°, 90°, 180°, and 270° phase differences) in addition to the possible phase differences due to the initial frequency dividers by themselves.

In either case, both frequency dividers in an LO path may be synchronized with another pair of dividers in another LO path using an additional pulse swallowing circuit in each LO path in front of the additional divider. This approach may allow multiple LO signals to be synchronized (e.g., for different bands).

Figure 6:
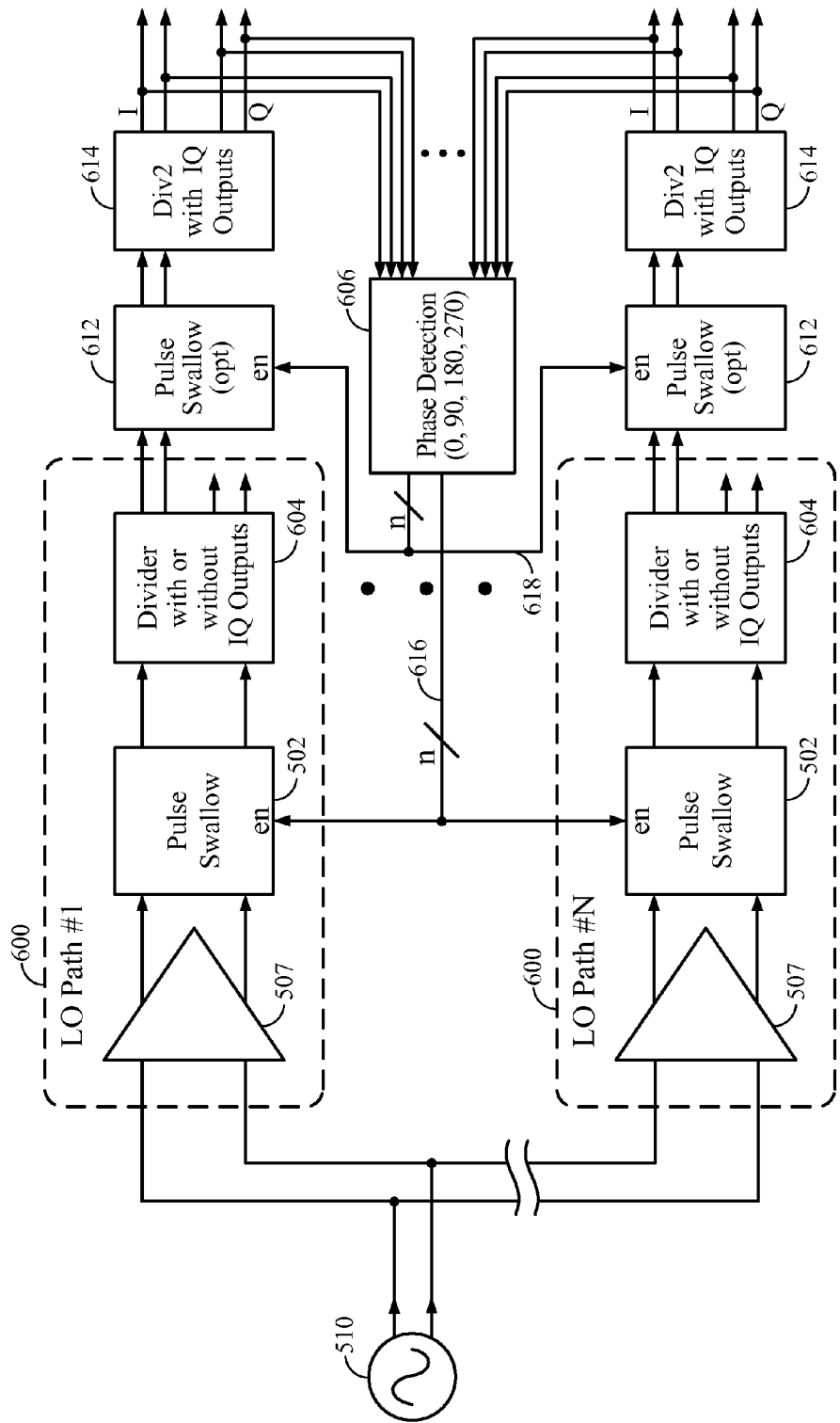
FIG. 6 is a block diagram of multiple example LO paths, where an alternative phase detection technique and optional pulse swallowing circuits are used in each LO path, in accordance with certain aspects of the present disclosure.

For example, FIG. 6 is a block diagram of N example LO paths 600 (e.g., TX LO paths 317 or RX LO paths 329), in which an alternative phase detection technique and/or optional pulse swallowing circuits 612 may be used in each LO path, in accordance with certain aspects of the present disclosure. As illustrated in FIG. 6, each LO path 600 may include a pulse swallowing circuit 502 and a first frequency divider 604. The pulse swallowing circuit 602 may be connected with the first frequency divider 604 to alter periodic signals intended for the first frequency divider 604, as described herein. For certain aspects, each LO path 600 may also include a second frequency divider 614, or the second frequency divider 614 may be part of a separate phase detection path, as described above. Each frequency divider 604, 614 is configured to frequency divide an input periodic signal into an output periodic signal having a lower frequency. For example, each frequency divider 604, 614 may be a Div2, Div3, or Div4 frequency divider. The first frequency divider 604 may be configured with or without I and Q output signals, and the second frequency divider 614 may be configured to output I and Q signals, as illustrated in FIG. 6.

Each LO path 600 may also include an input amplifier 507 and/or an output amplifier 508 (not shown in FIG. 6). The input amplifier 507 may be configured to buffer or amplify an oscillating signal received from the VCO 510 as described above. An output amplifier 508 may be configured to buffer or amplify an output (e.g., the I and/or Q outputs) of the first frequency divider 604 and/or the second frequency divider 614.

For certain aspects, the second frequency divider 614 may be employed to decrease the phase detection frequency for various reasons. In this case, each LO path 600 may be connected with a separate phase detection path including the second frequency divider 614. The signals for each phase detection path may be input from the first frequency divider 604 or from an amplifier (not shown in FIG. 6, but similar to output amplifier 508 in FIG. 5) configured to amplify or buffer the divided signals from the first frequency divider 604 before being into the second frequency divider 614. In this case, the phase detection and pulse swallowing may operate similarly to that described above for FIG. 5, the main differences being: (1) that the frequency of signals input to the phase detection circuit 606 in FIG. 6 may be reduced compared to the frequency of signals input to the phase detection circuit 506 in FIG. 5; and (2) that the phase detection circuit 606 may be configured to detect more phase differences than the phase detection circuit 506. For example, if the frequency divider 504 is a Div2 divider, then the phase detection circuit 506 in FIG. 5 may be configured to detect 0° and 180° phase differences. In contrast, if the first and second frequency dividers 604, 614 are both Div2 dividers, then the phase detection circuit 606 in FIG. 6 may be configured to detect 0°, 90°, 180°, and 270° phase differences. The phase detection circuit 606 may be configured to detect a higher number of phase differences than four if either the first or second divider 604, 614 frequency divides by more than two.

For certain aspects, each LO path 600 (or at least N−1 LO paths) may also include an optional pulse swallowing circuit 612. The pulse swallowing circuit 612 may be connected with the second frequency divider 614 to alter periodic signals intended for the second frequency divider 614, as described below. Use of the pulse swallowing circuit 612 may provide for synchronizing multiple LO signals in different frequency bands (e.g., (buffered) divided signals from the first frequency divider 604 can be synchronized with (buffered) divided signals from the second frequency divider 614), in addition to synchronizing corresponding LO signals among the various LO paths 600.

In this case, outputs (e.g., I and Q outputs) of the second frequency divider 614 (or of an output amplifier) of each LO path 600 may be input to the phase detection circuit 606, which may be configured to detect 0°, 90°, 180°, and 270° phase differences in the case of Div2 frequency dividers. Upon detecting the phase difference, the phase detection circuit 606 may provide appropriate activation signals 616, 618 for the first and/or second pulse swallowing circuits 602, 612, respectively, in a specific LO path 600 for swallowing one or more input clock pulses to the first and/or second frequency dividers 604, 614 in that specific LO path to adjust the phase of that particular divided signal. This phase detection and adjustment may be performed for the multiple LO paths 600 using a reference signal or iteratively in a daisy chain fashion, similar to that described above with respect to FIG. 5.

Figure 7:
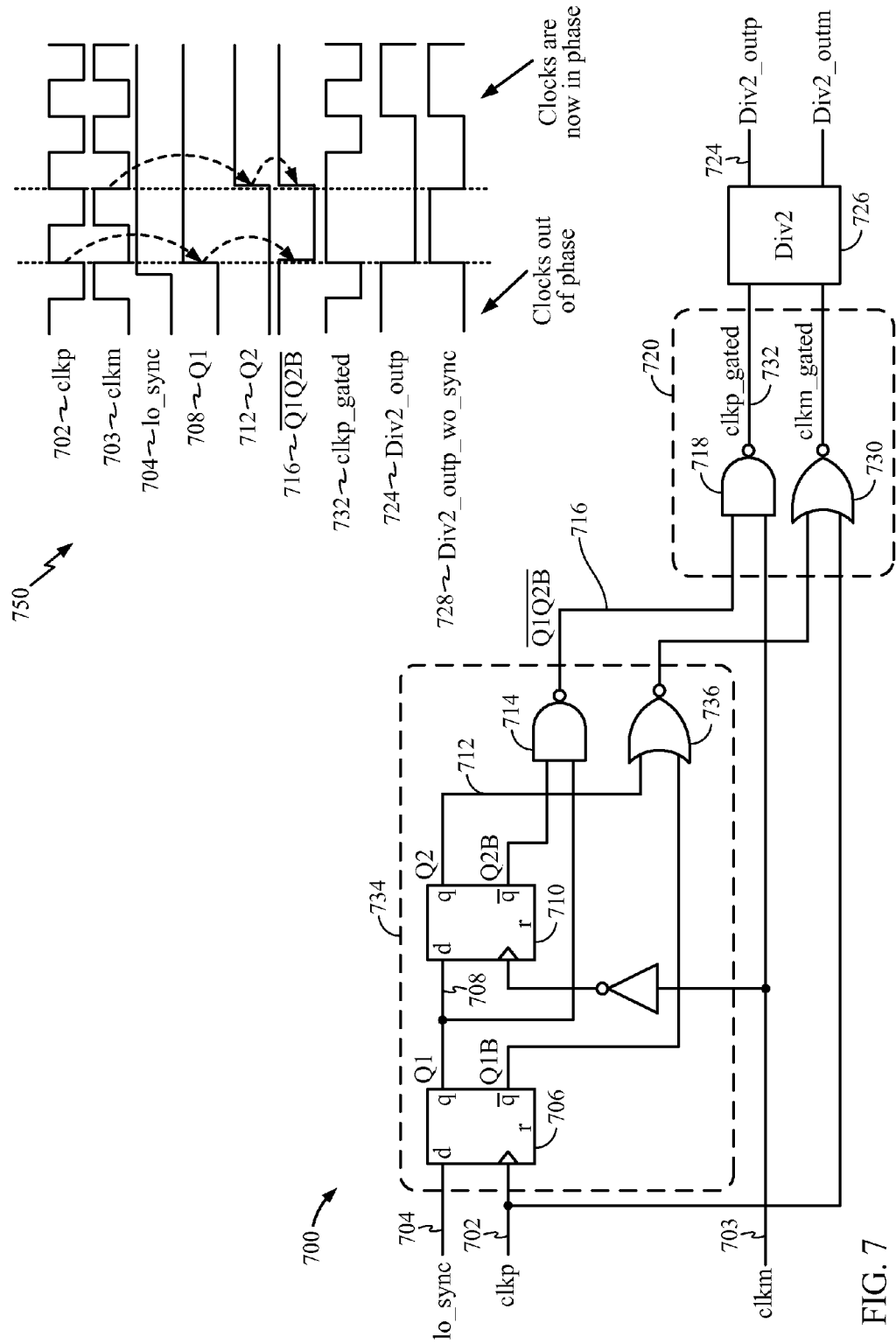
FIG. 7 illustrates an example pulse swallowing circuit (and an associated timing diagram), which may be utilized as the pulse swallowing circuits of FIGS. 5 and 6, in accordance with certain aspects of the present disclosure.

FIG. 7 illustrates an example pulse swallowing circuit 700 and a timing diagram 750 corresponding thereto, in accordance with certain aspects of the present disclosure. The pulse swallowing circuit 700 may be utilized for each of the pulse swallowing circuits 502 shown in FIG. 5. The pulse swallowing circuit 700 of FIG. 7 may also be implemented for each of the pulse swallowing circuits 602 and 612 depicted in FIG. 6.

The pulse swallowing circuit 700 may be configured to swallow (i.e., suppress or gate) one input clock pulse in order to flip a Div2 divider output phase by 180°. As illustrated in FIG. 7, a differential clock signal comprising complementary signals clock plus (labeled "clkp") 702 and clock minus (labeled "clkm") 703 may be input to the pulse swallowing circuit 700, along with an LO synchronization control signal (bit) 704 (labeled "lo_sync"). The differential clock signal may represent any differential periodic signal in an LO path, such as a buffered differential oscillating signal generated from a VCO. In some aspects of the present disclosure, the LO synchronization control bit 704 may be set by a phase detection circuit (e.g., the phase detection circuit 506 from FIG. 5 or the phase detection circuit 606 from FIG. 6) in case of a phase difference (e.g., 180° phase difference) between a pair of independent dividers in different LO paths of a frequency synthesizer.

As illustrated in FIG. 7, the pulse swallowing circuit 700 may comprise delay (D) flip-flops 706 and 710, NAND circuits 714 and 718, and NOR circuits 730 and 736. The LO synchronization control bit 704 may be the input to the D flip-flop 706, which may be clocked by clkp 702. The output (Q1 708) of D flip-flop 706 may be set (i.e., change from 0 to 1) as illustrated by the Q1 pulse once the LO synchronization control bit 704 is set, after the next rising edge of clkp 702. Q1 708 may be provided as the input to D flip-flop 710, which may be clocked by the inverse of clkm 703 (or by clkp 702 for certain aspects). Once Q1 708 is set (i.e., changes from 0 to 1), the output (Q2 712) of D flip-flop 710 may be set as illustrated by the Q2 pulse after the next rising edge of the inverse of clkm 703 (equivalent to the next falling edge of clkm 703).

NAND circuit 714 may receive as inputs the output (Q1 708) of D flip-flop 706 and the complementary output (Q2B) of D flip-flop 710, having the opposite polarity of Q2 712. Based on these inputs, NAND circuit 714 may generate inverted pulse (Q1Q2B)*716 as shown in the timing diagram 750. NOR circuit 736 may receive as inputs the complementary output (Q1B) of D flip-flop 706 and the output (Q2 712) of D flip-flop 710. The output of NOR circuit 736 is (Q1B+Q2)*, which is effectively the inverse of inverted pulse (Q1Q2B)*716.

The output of NAND circuit 714 (e.g., the inverted pulse (Q1Q2B)*716) and clkm 703 may be input to NAND circuit 718 of clock gating circuitry 720 to generate a gated clock signal 732 (labeled "clkp_gated"). The gated clock signal 732 effectively tracks clkp 702, except during the inverted pulse output by NAND circuit 714, where the clock pulse of clkp 702 is skipped (i.e., swallowed). The output of NOR circuit 736 and clkp 702 may be input to NOR circuit 730 of the clock gating circuitry 720 to generate a complementary gated clock signal (labeled "clkm_gated"). The complementary gated clock signal effectively follows clkm 703, except during the pulse output by NOR circuit 736, where the clock pulse of clkm 703 is suppressed.

As illustrated in FIG. 7, clkp_gated 732 (and clkm_gated) represent the output of the pulse swallowing circuit 700 where a clock pulse of clkp 702 (and of clkm 703) have been swallowed (i.e., suppressed or gated). As a result, the phase of clock signal 724 (labeled "Div2_outp") output by a Div2 frequency divider 726 may be effectively shifted 180° after the LO synchronization control bit 704 is set, and in this manner, the output clock signal 724 may be synchronized (become in-phase) with an output clock signal 728 (labeled "Div2_outp_wo_sync") of another Div2 frequency divider in a different LO path of the frequency synthesizer.

Based on this description, D flip-flops 706, 710, NAND circuit 714, and NOR circuit 736 may be considered as composing gating pulse generation circuitry 734, where the outputs of NAND circuit 714 and NOR circuit 736 are trigger pulses that activate clock pulse suppression in the pulse swallowing circuit 700. The actual clock pulse suppression is performed by the clock gating circuitry 720, which includes NOR circuit 730 and NAND circuit 718.

Figure 8:
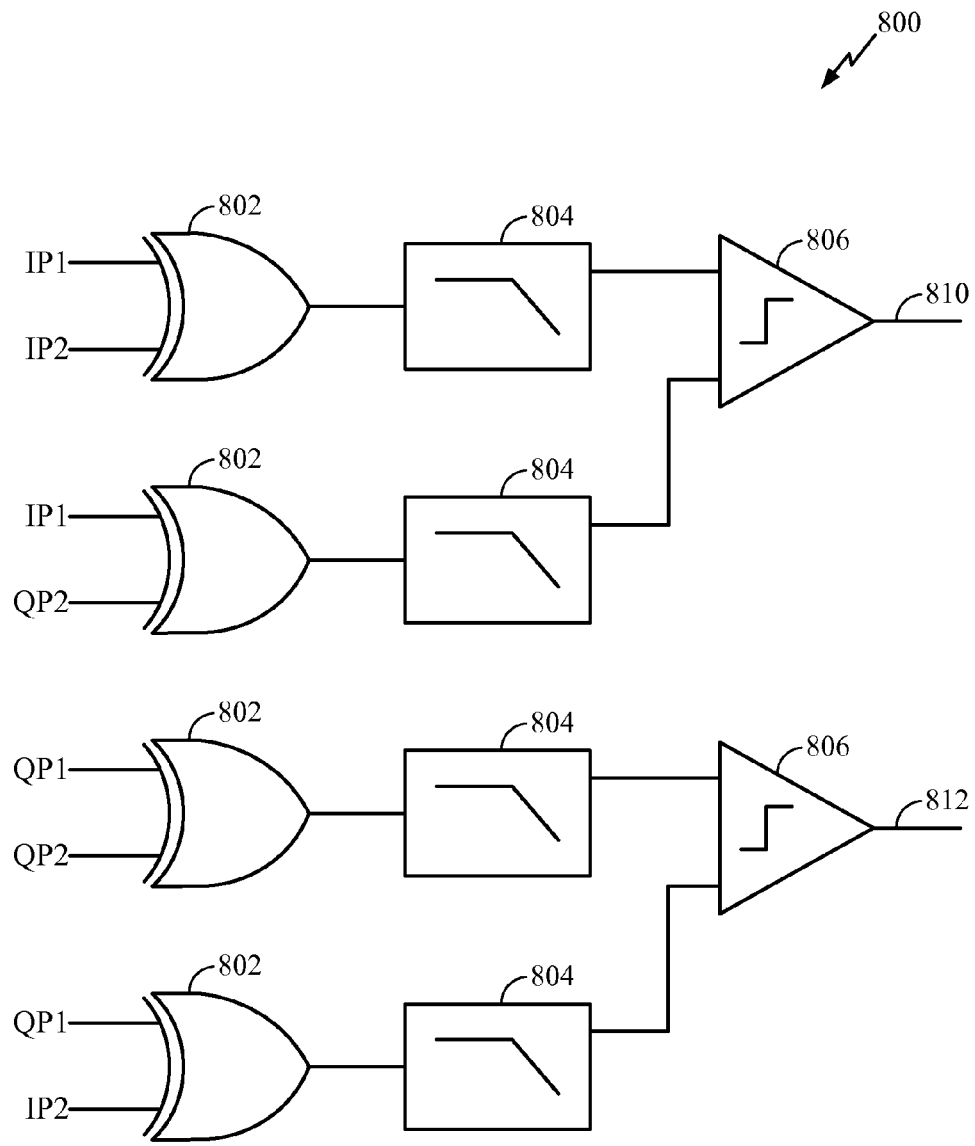
FIG. 8 is a block diagram of an example phase detection circuit, which may be utilized as the phase detection circuits of FIGS. 5 and 6, in accordance with certain aspects of the present disclosure.

FIG. 8 is a block diagram of an example phase detection circuit 800, in accordance with certain aspects of the present disclosure. According to some aspects of the present disclosure, the phase detection circuit 800 may correspond to the phase detection circuit 606 of FIG. 6 for detecting 0°, 90°, 180°, and 270° degree phase differences. In some aspects, a portion of the phase detection circuit 800 may be utilized as the phase detection circuit 506 of FIG. 5 for detecting 0° and 180° phase differences.

As illustrated in FIG. 8, the phase detection circuit 800 may include exclusive OR (XOR) gates 802 for comparing different combinations of I and Q signals output by a pair of independent frequency dividers located in different LO paths of a frequency synthesizer. For example, the positive I and Q signals (IP1 and QP1) from a frequency divider in a first LO path are compared in FIG. 8 to the positive I and Q signals (IP2 and QP2) from a corresponding frequency divider in a second LO path. Digital outputs of the XOR gates 802 may be input to low-pass filters (LPFs) 804 for conversion to DC (e.g., by averaging). For other aspects, the negative I and Q signals (complementary to the positive I and Q signals) may be used instead. Outputs of the low-pass filters 804 may be input to a set of comparators 806 to generate digital control outputs, where the bit values of the digital control outputs represent different phase differences. In the example of FIG. 8, four different two-bit values (e.g., values 00b, 01b, 10b, and 11b of comparator output bits 810, 812) may correspond to four different phase differences (e.g., 0°, 90°, 180°, and 270° phase differences).

For certain aspects, only a portion of the phase detection circuit 800 may be used. For example, a 0°/180° phase detector (e.g., the phase detection circuit 506 of FIG. 5) may use one of the XOR gates 802 and a corresponding low-pass filter 804. A comparator 806 need not be used.

Figure 4:
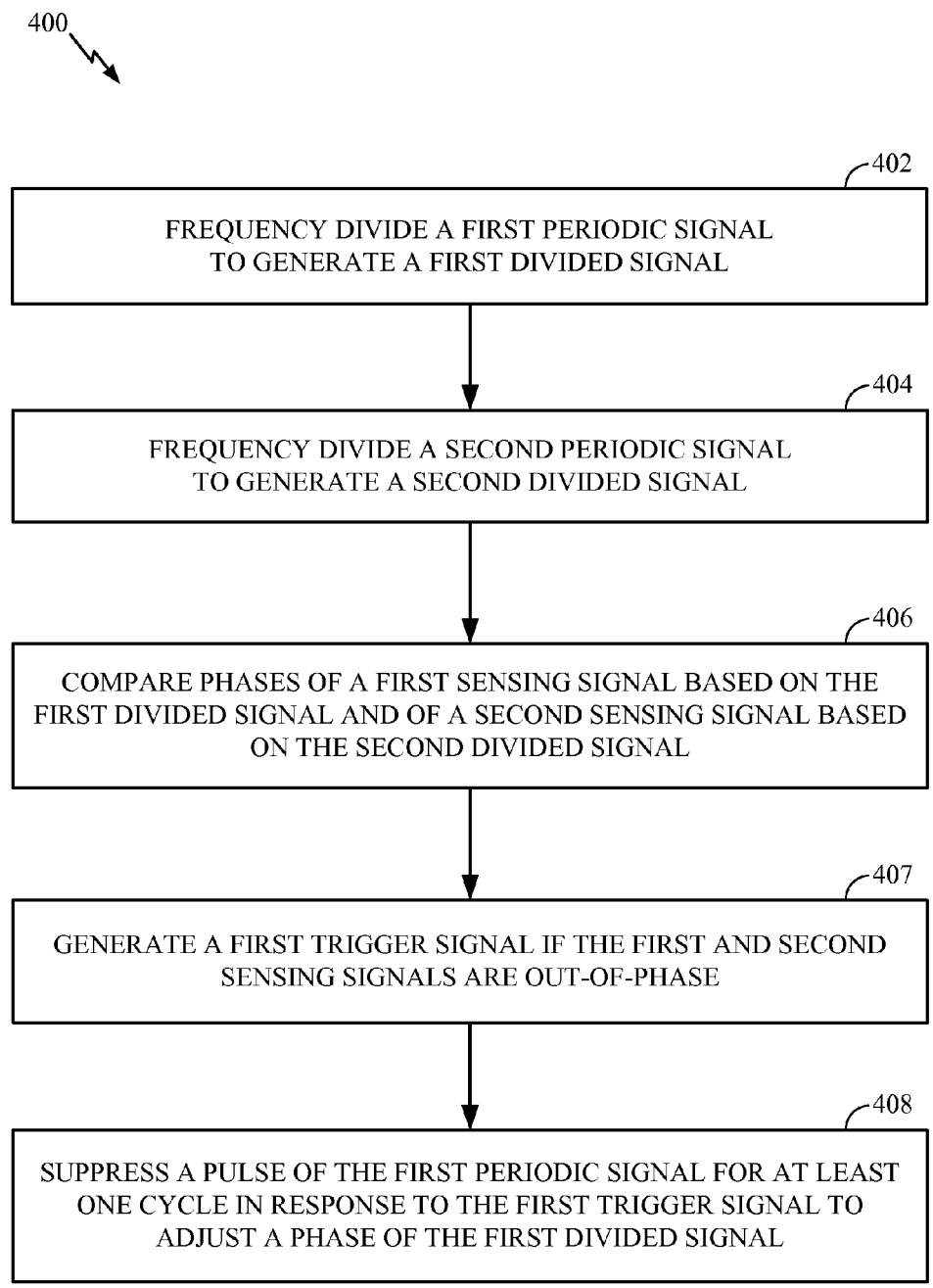
FIG. 4 is a flow diagram of example operations for generating multiple periodic signals using frequency division and pulse suppression, in accordance with certain aspects of the present disclosure.

FIG. 4 is a flow diagram of example operations 400 for generating multiple periodic signals using frequency division and pulse suppression, in accordance with certain aspects of the present disclosure. The operations 400 may be performed, for example, by a frequency synthesizer (e.g., TX or RX frequency synthesizer 318, 330) or other apparatus with multiple oscillator paths having independent frequency dividers in each path, such as the LO paths 500 in FIG. 5 or the LO paths 600 in FIG. 6.

The operations 400 may begin, at block 402, by frequency dividing a first periodic signal to generate a first divided signal (e.g., with a frequency divider 504, 604 in a first LO path 500, 600). At block 404, a second periodic signal may be frequency divided to generate a second divided signal (e.g., with a different frequency divider 504, 604 in a different LO path 500, 600). At block 406, phases of a first sensing signal (based on the first divided signal) and of a second sensing signal (based on the second divided signal) may be compared. At block 407, a first trigger signal may be generated if the first and second sensing signals are out-of-phase. At block 408, a pulse of the first periodic signal may be suppressed for at least one cycle in response to the first trigger signal in an effort to adjust a phase of the first divided signal. For certain aspects, the phase of the first divided signal is adjusted such that the first and second divided signals are in-phase (synchronized).

According to certain aspects, the first sensing signal is the first divided signal (e.g., the output of frequency divider 504) or is a buffered version of the first divided signal (e.g., the output of amplifier 508). Likewise, the second sensing signal may be the second divided signal or may be a buffered version of the second divided signal. For example, the operations 400 may further involve buffering the first divided signal to form a buffered version of the first divided signal and buffering the second divided signal to form a buffered version of the second divided signal.

According to certain aspects, the operations 400 may further entail generating a second trigger signal if the first and second sensing signals are out-of-phase and suppressing a pulse of the second periodic signal for at least one cycle in response to the second trigger signal in an effort to adjust a phase of the second divided signal.

According to certain aspects, the operations 400 may further involve frequency dividing the first divided signal to generate a third divided signal. The first sensing signal may be the third divided signal or a buffered version of the third divided signal. The operations 400 may also include frequency dividing the second divided signal to generate a fourth divided signal. The second sensing signal may be the fourth divided signal or a buffered version of the fourth divided signal.

According to certain aspects, the operations 400 may further involve generating a second trigger signal if the first and second sensing signals are out-of-phase and suppressing a pulse of the first divided signal for at least one cycle in response to the second trigger signal in an effort to adjust a phase of the third divided signal. In this case, the operations 400 may also entail generating a third trigger signal if the first and second sensing signals are out-of-phase and suppressing a pulse of the second periodic signal for at least one cycle in response to the third trigger signal in an effort to adjust a phase of the second divided signal. If the first and second sensing signals are out-of-phase, the operations 400 may also include generating a fourth trigger signal and suppressing a pulse of the second divided signal for at least one cycle in response to the fourth trigger signal in an effort to adjust a phase of the fourth divided signal.

According to certain aspects, the operations 400 may further involve frequency dividing a third periodic signal to generate a third divided signal. In this case, phases of a third sensing signal based on the third divided signal and of either the first sensing signal or the second sensing signal may be compared, and a second trigger signal may be generated if the third sensing signal and either the first or second sensing signal, respectively, are out-of-phase. The operations 400 may further include suppressing a pulse of the third periodic signal for at least one cycle in response to the second trigger signal in an effort to adjust a phase of the third divided signal.

According to certain aspects, frequency dividing the first periodic signal at block 402 may entail frequency dividing the first periodic signal to generate in-phase (I) and quadrature (Q) versions of the first divided signal. For certain aspects, frequency dividing the second periodic signal at block 404 may involve frequency dividing the second periodic signal to generate I and Q versions of the second divided signal. In this case, the first sensing signal may be based on the I (or Q) version of the first divided signal, and the second sensing signal may be based on the I (or Q) version of the second divided signal.

According to certain aspects, comparing the phases at block 406 involves comparing the phases of the first and second sensing signals to detect a 0 or 180° phase difference between the first and second sensing signals. For other aspects, the phases of the first and second sensing signals may be compared at block 406 to detect a 0, 90°, 180°, or 270° phase difference between the first and second sensing signals.

According to certain aspects, the operations 400 further involve generating the first periodic signal from an output signal of a voltage-controlled oscillator (VCO) and generating the second periodic signal from the same output signal of the VCO.

By applying the synchronization techniques presented in this disclosure, performance improvement in an RF front-end of a transceiver may be achieved. For example, bimodality (e.g., due to random and parasitic mismatch between two LO paths) may be eliminated. Elimination of the bimodality may improve DC offset in RX paths and carrier leakage in TX paths because flipping of LO signals using a multiplexer need not be employed for aspects of the present disclosure. Eliminating the bimodality may also improve image rejection in RX paths and residual side band (RSB) in TX paths because slight phase differences between the flipped and un-flipped LO paths may not exist, unlike conventional synchronization solutions.

The synchronization techniques presented in this disclosure may also eliminate dynamical swapping of I and Q baseband outputs (e.g., in RX paths) or inputs (e.g., in TX paths) after each reset or power down. Furthermore, certain aspects of the present disclosure may simplify calibrations of DC offset, image rejection, RSB, and carrier leakage due to no inherent bimodal behavior.

The various operations or methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antennas 303 of the transceiver front-end 300 depicted in FIG. 3). Means for receiving may comprise a receiver (e.g., the transceiver front-end 254 of the user terminal 120 depicted in FIG. 2, the transceiver front-end 222 of the access point 110 shown in FIG. 2, or the transceiver front-end 300 illustrated in FIG. 3) and/or an antenna (e.g., the antennas 252*ma* through 252*mu* of the user terminal 120*m* portrayed in FIG. 2, the antennas 224*a* through 224*ap* of the access point 110 illustrated in FIG. 2, or the antennas 303 of the transceiver front-end 300 depicted in FIG. 3). Means for processing or means for determining may comprise a processing system, which may include one or more processors (e.g., the TX data processor 210, the RX data processor 242, and/or the controller 230 of the access point 110 shown in FIG. 2, or the RX data processor 270, the TX data processor 288, and/or the controller 280 of the user terminal 120 illustrated in FIG. 2). Means for frequency dividing may comprise one or more frequency dividing circuits (e.g., the frequency dividers 504 of FIG. 5 or the frequency dividers 604, 614 of FIG. 6). Means for comparing may comprise one or more phase comparing circuits (e.g., the phase detection circuit 506 of FIG. 5, the phase detection circuit 606 of FIG. 6, or the phase detection circuit 800 of FIG. 8). Means for generating a trigger signal may comprise one or more trigger generating circuits (e.g., the phase detection circuit 506 of FIG. 5, the phase detection circuit 606 of FIG. 6, or the phase detection circuit 800 of FIG. 8). Means for suppressing may comprise one or more pulse suppressing circuits (e.g., the pulse swallowing circuits 502 of FIG. 5, the pulse swallowing circuits 502, 612 of FIG. 6, or the pulse swallowing circuit 700 of FIG. 7).

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application-specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus, comprising:
   a first circuit path having a first frequency divider configured to frequency divide a first periodic signal to generate a first divided signal;
   a second circuit path having a second frequency divider configured to frequency divide a second periodic signal to generate a second divided signal;
   a phase detection circuit coupled to the first and second circuit paths and configured to:
   compare phases of a first sensing signal based on the first divided signal and of a second sensing signal based on the second divided signal; and
   generate a first trigger signal if the first and second sensing signals are out-of-phase; and
   a first pulse suppression circuit coupled to the phase detection circuit and configured to suppress a pulse of the first periodic signal for at least one cycle in response to the first trigger signal to adjust a phase of the first divided signal.

2. The apparatus of claim 1, wherein the first sensing signal is the first divided signal and wherein the second sensing signal is the second divided signal.

3. The apparatus of claim 1, wherein the first sensing signal is a buffered version of the first divided signal and wherein the second sensing signal is a buffered version of the second divided signal.

4. The apparatus of claim 1, further comprising:
   a second pulse suppression circuit coupled to the phase detection circuit, wherein the phase detection circuit is configured to generate a second trigger signal if the first and second sensing signals are out-of-phase and wherein the second pulse suppression circuit is configured to suppress a pulse of the second periodic signal for at least one cycle in response to the second trigger signal to adjust a phase of the second divided signal.

5. The apparatus of claim 1, further comprising:
   a third frequency divider configured to frequency divide the first divided signal to generate a third divided signal, wherein the first sensing signal is the third divided signal; and
   a fourth frequency divider configured to frequency divide the second divided signal to generate a fourth divided signal, wherein the second sensing signal is the fourth divided signal.

6. The apparatus of claim 5, further comprising:
   a second pulse suppression circuit coupled to the phase detection circuit, wherein the phase detection circuit is configured to generate a second trigger signal if the first and second sensing signals are out-of-phase, wherein the second pulse suppression circuit is configured to suppress a pulse of the first divided signal for at least one cycle in response to the second trigger signal to adjust a phase of the third divided signal.

7. The apparatus of claim 6, further comprising:
   a third pulse suppression circuit coupled to the phase detection circuit, wherein the phase detection circuit is configured to generate a third trigger signal if the first and second sensing signals are out-of-phase and wherein the third pulse suppression circuit is configured to suppress a pulse of the second periodic signal for at least one cycle in response to the third trigger signal to adjust a phase of the second divided signal.

8. The apparatus of claim 7, further comprising:
   a fourth pulse suppression circuit coupled to the phase detection circuit, wherein the phase detection circuit is configured to generate a fourth trigger signal if the first and second sensing signals are out-of-phase and wherein the fourth pulse suppression circuit is configured to suppress a pulse of the second divided signal for at least one cycle in response to the fourth trigger signal to adjust a phase of the fourth divided signal.

9. The apparatus of claim 1, further comprising:
   a third frequency divider configured to frequency divide the first divided signal to generate a third divided signal, wherein the first sensing signal is a buffered version of the third divided signal; and
   a fourth frequency divider configured to frequency divide the second divided signal to generate a fourth divided signal, wherein the second sensing signal is a buffered version of the fourth divided signal.

10. The apparatus of claim 1, further comprising:
    a third circuit path having a third frequency divider configured to frequency divide a third periodic signal to generate a third divided signal, wherein the phase detection circuit is further coupled to the third circuit path and is further configured to:
    compare phases of a third sensing signal based on the third divided signal and of either the first sensing signal or the second sensing signal; and
    generate a second trigger signal if the third sensing signal and either the first or second sensing signal, respectively, are out-of-phase; and
    a second pulse suppression circuit coupled to the phase detection circuit and configured to suppress a pulse of the third periodic signal for at least one cycle in response to the second trigger signal to adjust a phase of the third divided signal.

11. The apparatus of claim 1, wherein the first pulse suppression circuit comprises:

a plurality of delay (D) flip-flops and first combinational logic interfaced with outputs of the plurality of D flip-flops to generate a gating pulse based on the first periodic signal and the first trigger signal; and second combinational logic interfaced with outputs of the first combinational logic and the first periodic signal and configured to suppress the pulse of the first periodic signal for the at least one cycle based on the gating pulse.

12. The apparatus of claim 1, wherein the phase detection circuit comprises:
exclusive OR (XOR) logic configured to receive the first and second sensing signals;
one or more low-pass filters coupled to the XOR logic; and
one or more comparators coupled to the one or more low-pass filters and configured to generate one or more outputs of the phase detection circuit, including the first trigger signal.

13. The apparatus of claim 1, wherein the phase detection circuit is configured to compare the phases of the first and second sensing signals if the apparatus is reset or power cycled.

14. The apparatus of claim 1, wherein:
the first frequency divider comprises a first in-phase/quadrature (I/Q) frequency divider configured to generate I and Q versions of the first divided signal; and
the second frequency divider comprises a second I/Q frequency divider configured to generate I and Q versions of the second divided signal.

15. The apparatus of claim 14, wherein the first sensing signal is based on the I version of the first divided signal and wherein the second sensing signal is based on the I version of the second divided signal.

16. The apparatus of claim 1, wherein the phase detection circuit is configured to detect a 0, 90°, 180°, or 270° phase difference between the first and second sensing signals.

17. The apparatus of claim 1, further comprising:
a voltage-controlled oscillator (VCO);
a first amplifier configured to generate the first periodic signal from an output signal of the VCO; and
a second amplifier configured to generate the second periodic signal from the output signal of the VCO.

18. A method of generating multiple periodic signals, comprising:
frequency dividing a first periodic signal to generate a first divided signal;
frequency dividing a second periodic signal to generate a second divided signal;
comparing phases of a first sensing signal based on the first divided signal and of a second sensing signal based on the second divided signal;
generating a first trigger signal if the first and second sensing signals are out-of-phase; and
suppressing a pulse of the first periodic signal for at least one cycle in response to the first trigger signal to adjust a phase of the first divided signal.

19. The method of claim 18, further comprising:
buffering the first divided signal to form a buffered version of the first divided signal, wherein the first sensing signal is the buffered version of the first divided signal; and
buffering the second divided signal to form a buffered version of the second divided signal, wherein the second sensing signal is the buffered version of the second divided signal.

20. The method of claim 18, further comprising:
generating a second trigger signal if the first and second sensing signals are out-of-phase; and
suppressing a pulse of the second periodic signal for at least one cycle in response to the second trigger signal to adjust a phase of the second divided signal.

21. The method of claim 18, further comprising:
frequency dividing the first divided signal to generate a third divided signal, wherein the first sensing signal is the third divided signal; and
frequency dividing the second divided signal to generate a fourth divided signal, wherein the second sensing signal is the fourth divided signal.

22. The method of claim 21, further comprising:
generating a second trigger signal if the first and second sensing signals are out-of-phase; and
suppressing a pulse of the first divided signal for at least one cycle in response to the second trigger signal to adjust a phase of the third divided signal.

23. The method of claim 22, further comprising:
generating a third trigger signal if the first and second sensing signals are out-of-phase; and
suppressing a pulse of the second periodic signal for at least one cycle in response to the third trigger signal to adjust a phase of the second divided signal.

24. The method of claim 23, further comprising:
generating a fourth trigger signal if the first and second sensing signals are out-of-phase; and
suppressing a pulse of the second divided signal for at least one cycle in response to the fourth trigger signal to adjust a phase of the fourth divided signal.

25. The method of claim 18, further comprising:
frequency dividing a third periodic signal to generate a third divided signal;
comparing phases of a third sensing signal based on the third divided signal and of either the first sensing signal or the second sensing signal;
generating a second trigger signal if the third sensing signal and either the first or second sensing signal, respectively, are out-of-phase; and
suppressing a pulse of the third periodic signal for at least one cycle in response to the second trigger signal to adjust a phase of the third divided signal.

26. The method of claim 18, wherein:
frequency dividing the first periodic signal comprises frequency dividing the first periodic signal to generate in-phase (I) and quadrature (Q) versions of the first divided signal;
frequency dividing the second periodic signal comprises frequency dividing the second periodic signal to generate I and Q versions of the second divided signal;
the first sensing signal is based on the Q version of the first divided signal; and
the second sensing signal is based on the Q version of the second divided signal.

27. The method of claim 18, wherein the comparing comprises comparing the phases of the first and second sensing signals to detect a 0 or 180° phase difference between the first and second sensing signals.

28. The method of claim 18, wherein the phase of the first divided signal is adjusted such that the first and second divided signals are in-phase.

29. The method of claim 18, further comprising:
generating the first periodic signal from an output signal of a voltage-controlled oscillator (VCO); and
generating the second periodic signal from the output signal of the VCO.

30. An apparatus, comprising:
means for frequency dividing a first periodic signal to generate a first divided signal;
means for frequency dividing a second periodic signal to generate a second divided signal;
means for comparing phases of a first sensing signal based on the first divided signal and of a second sensing signal based on the second divided signal;
means for generating a first trigger signal if the first and second sensing signals are out-of-phase; and
means for suppressing a pulse of the first periodic signal for at least one cycle in response to the first trigger signal to adjust a phase of the first divided signal.

* * * * *